(12) United States Patent
Garcia et al.

(10) Patent No.: US 7,691,675 B2
(45) Date of Patent: Apr. 6, 2010

(54) ENCAPSULATING ELECTRICAL CONNECTIONS

(75) Inventors: Carlos B. W. Garcia, Albany, OR (US); M. Jeffery Igelman, Corvallis, OR (US); Paul David Schweitzer, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 966 days.

(21) Appl. No.: 11/257,273

(22) Filed: Oct. 24, 2005

(65) Prior Publication Data

US 2007/0093001 A1  Apr. 26, 2007

(51) Int. Cl.
  *H01L 21/00* (2006.01)
(52) U.S. Cl. ............... 438/112; 438/124; 438/126; 257/E23.133
(58) Field of Classification Search ........... 438/112, 438/124, 126; 257/E23.133
See application file for complete search history.

(56) References Cited

U.S. PATENT DOCUMENTS

| | | | |
|---|---|---|---|
| 5,037,779 A | 8/1991 | Whalley et al. | |
| 5,258,331 A * | 11/1993 | Masumoto et al. | 29/827 |
| 5,736,998 A | 4/1998 | Caren et al. | |
| 6,074,895 A * | 6/2000 | Dery et al. | 438/108 |
| 6,318,843 B1 * | 11/2001 | Feder et al. | 347/47 |
| 6,322,200 B1 | 11/2001 | Feinn et al. | |
| 6,361,160 B2 | 3/2002 | Feinn et al. | |
| 6,402,299 B1 | 6/2002 | Demeerleer | |
| 6,641,254 B1 * | 11/2003 | Boucher et al. | 347/50 |
| 6,834,937 B2 | 12/2004 | Spivey et al. | |
| 6,876,090 B2 | 4/2005 | Mensch et al. | |
| 2001/0012642 A1 * | 8/2001 | Kodnani et al. | 438/107 |
| 2001/0038166 A1 * | 11/2001 | Weber | 264/272.15 |
| 2002/0118254 A1 | 8/2002 | Wong et al. | |
| 2003/0193545 A1 * | 10/2003 | Boucher et al. | 347/50 |
| 2004/0061741 A1 | 4/2004 | Aschoff et al. | |
| 2004/0218009 A1 | 11/2004 | Akhavain et al. | |
| 2005/0073552 A1 | 4/2005 | Smoot et al. | |
| 2005/0078143 A1 | 4/2005 | Shimomura et al. | |
| 2005/0093927 A1 | 5/2005 | Lassar et al. | |

FOREIGN PATENT DOCUMENTS

EP  0917191  5/1999
WO  WO2006062244  6/2006

* cited by examiner

*Primary Examiner*—Fernando L. Toledo
*Assistant Examiner*—Jarrett J Stark

(57) ABSTRACT

An electrical connection is encapsulated by dispensing an encapsulant on a first side of the electrical connection only, and directing the encapsulant to a second side of the electrical connection from the first side, where the second side generally faces opposite the first side.

25 Claims, 4 Drawing Sheets

ENCAPSULATING ELECTRICAL CONNECTIONS

BACKGROUND

Fluid-ejection devices, such as print heads, usually include a carrier and a fluid-ejecting substrate (or print die), e.g., formed from silicon or the like using semiconductor processing methods, such as photolithography or the like. Conventionally, electrical interconnections are made using a flexible circuit that has metal leads that are coupled to bond pads located on the fluid-ejecting substrate. The metal leads and bond pads are usually encapsulated for protection. Encapsulation is usually accomplished by dispensing an encapsulant (or adhesive) to the bottom of the flexible circuit, curing the encapsulant, turning flexible circuit over, dispensing encapsulant on the top of the flexible circuit and over the bond pads, and curing the encapsulant. Subsequently, the fluid-ejecting substrate and the flexible circuit are adhered to the carrier. However, this produces stresses on the fluid-ejecting substrate where the flexible circuit is attached that could damage the fluid-ejecting substrate.

DETAILED DESCRIPTION

In the following detailed description of the present embodiments, reference is made to the accompanying drawings that form a part hereof, and in which are shown by way of illustration specific embodiments that may be practiced. These embodiments are described in sufficient detail to enable those skilled in the art to practice disclosed subject matter, and it is to be understood that other embodiments may be utilized and that process, electrical or mechanical changes may be made without departing from the scope of the claimed subject matter. The following detailed description is, therefore, not to be taken in a limiting sense, and the scope of the claimed subject matter is defined only by the appended claims and equivalents thereof.

Figure 1:
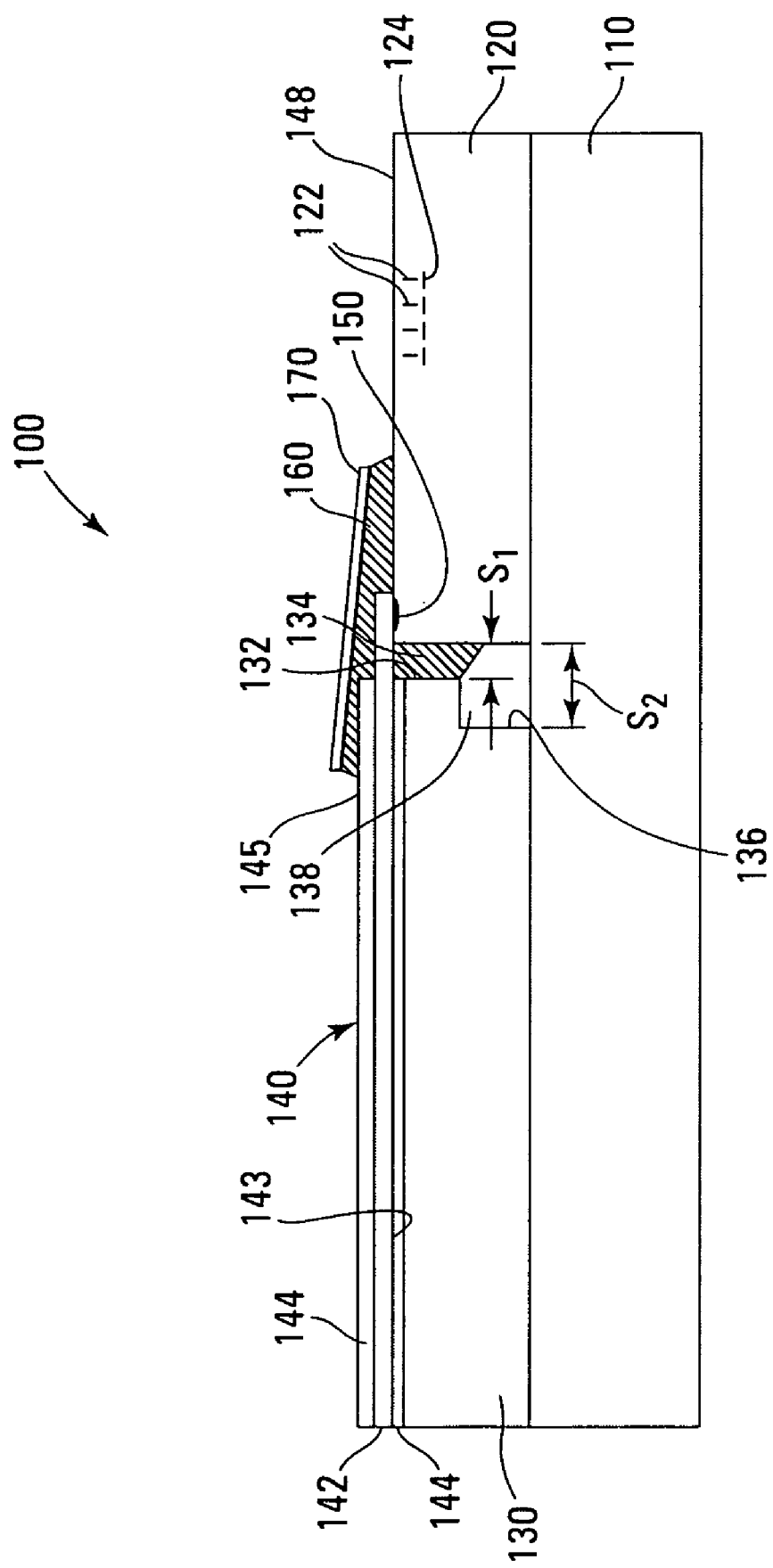
FIG. 1 is a cross-sectional view of an embodiment of a fluid-ejection device, according to an embodiment of the invention.

FIG. 1 is a cross-sectional view of a fluid-ejection device 100, such as a print head, according to an embodiment. Fluid-ejection device 100 includes a carrier 110 that may be fabricated from plastic, ceramic, silicon, or the like. A fluid-ejecting substrate 120 (e.g., a print-head die or substrate) is adhered to carrier 110. For one embodiment, fluid-ejecting substrate 120 includes orifices (or nozzles) 122 and resistors 124. Resistors 124 are selectively energized to rapidly heat a fluid, e.g., a marking fluid, such as ink, channeled thereto, causing the fluid to be expelled through orifices 122 in the form of droplets. Note that fluid-ejection device 100 is inverted with respect to its normal operating orientation so that orifices 122 are directed upward. Hereinafter, for purposes of discussing FIG. 1, terms, such as "up" and "down," "upper" and "lower," etc., will used and are taken to be relative to FIG. 1. Note, however, for one embodiment, fluid-ejection device 100 is oriented as is shown in FIG. 1 during manufacturing.

A spacer 130, e.g., a polymer layer (or film), is also adhered to an upper surface of carrier 110. Spacer 130 is substantially co-planer with fluid-ejecting substrate 120 and is located laterally of fluid-ejecting substrate 120. A portion 132 of an end of spacer 130 is located at a lateral distance $S_1$, e.g. about 125 to about 250 microns, from fluid-ejecting substrate 120 to form a channel 134 between end portion 132 and a side of fluid-ejecting substrate 120. For one embodiment, a thickness of end portion 132 can vary, e.g. about 100 to about 500 microns. A portion 136 of the end of spacer 130 is recessed relative to end portion 132 so that end portion 136 is located at a lateral distance $S_2$>lateral distance $S_1$ from fluid-ejecting substrate 120 to form a channel expansion 138 between end portion 136 and the side of fluid-ejecting substrate 120. Note that channel 134 opens into channel expansion 138.

A flexible circuit 140 is adhered to spacer 130, as shown in FIG. 1. For one embodiment, flexible circuit 140 is configured as a flying-lead assembly and includes electrical leads 142 formed in a film 144 and that extend from an end of film 144. Specifically, for one embodiment, a lower portion of film 144 is adhered to an upper surface spacer 130, e.g., by heat staking. For one embodiment, film 144 may be a polymer, such as polyimide, polyester, polyethylene naphthalate (PEN), etc. For another embodiment, a thickness of spacer 130 is selected so that when flexible circuit 140 is adhered thereto, a lower surface 143 of lead 142 is substantially flush with an upper surface 148 of fluid-ejecting substrate 120 at which orifices 122 terminate and so that lead 142 aligns with a contact 150 in fluid-ejecting substrate 120. Note that contact (or bond pad) 150 is electrically connected to one or more of the resistors 124.

Figure 2:
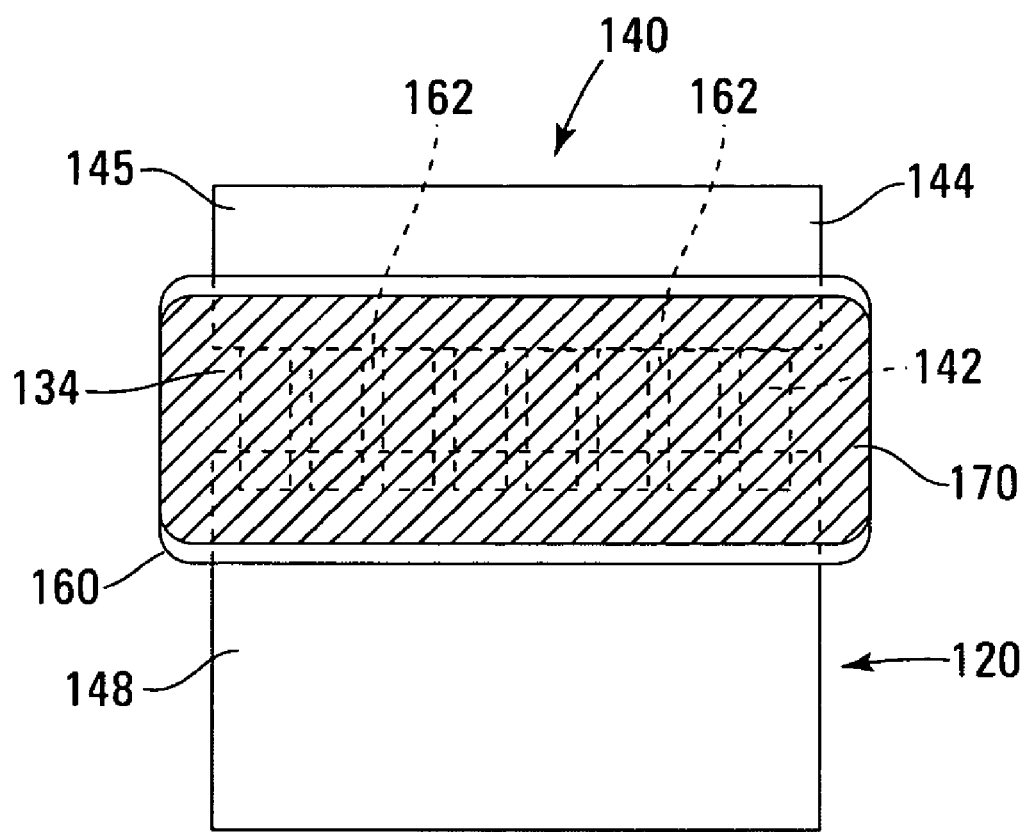
FIG. 2 is a top view of a portion of the fluid-ejection device of FIG. 1, according to another embodiment of the invention.

FIG. 2 is a top view of a portion of FIG. 1 illustrating leads 142 of flexible circuit 140 overlying upper surface 148 of fluid-ejecting substrate 120. Note that each of leads 142 respectively corresponds to a contact 150. FIG. 2 also shows an upper (or inlet) portion of channel 134.

For one embodiment, after adhering flexible circuit 140 to spacer 130, the ends of leads 142 are bonded to their respective contacts 150 of fluid-ejecting substrate 120 to form an electrical connection between flexible circuit 140 and fluid-ejecting substrate 120. Alternatively, the ends of leads 142 may be bonded to their respective contacts 150 before adhering flexible circuit 140 to spacer 130. For one embodiment, a conventional TAB bonder may be used to press the ends of leads 142 into contacts 150, as is known in the art. Note that connecting leads 142 to contacts 150 electrically connects resistors 124 to a controller, such as a printer controller, for selectively activating resistors 124.

After forming the electrical connection between flexible circuit 140 and fluid-ejecting substrate 120, the electrical connection is encapsulated using an encapsulant 160. Encapsulant 160 is dispensed, e.g., using a needle dispense, on portions of the electrical connection accessible from substantially one direction, above, and is wicked (or carried by capillary action) to portions of the electrical connection that are substantially inaccessible from above. More specifically, encapsulant 160 (FIGS. 1 and 2) is dispensed on an upper surface 145 of film 144, on upper portions of leads 142, and on upper surface 148 of fluid-ejecting substrate 120. Encapsulant 160 flows downward through interstices 162 between successively adjacent leads 142 (FIG. 2), around leads 142, and through channel 134 (FIG. 1).

For one embodiment, capillary action drives the flow of encapsulant 160. Specifically, forces between molecules of encapsulant 160 and surfaces of leads 142 that bound interstices 162 cause encapsulant 160 to wet these surfaces and produces the capillary action that draws adhesive 160 through interstices 162. Similarly, forces between molecules of encapsulant 160 and bounding surfaces of channel 134 (end portion 132 and the side of fluid-ejecting substrate 120) produce the capillary action that draws encapsulant 160 through channel 134. However, when encapsulant 160 reaches channel expansion 138, the surface tension of encapsulant 160 acts to prevent encapsulant 160 on end portion 132 from flowing past channel expansion 138, thus stopping the flow of encapsulant 160, as shown in FIG. 1. Therefore, channel expansion 138 functions as a capillary stop.

When encapsulant 160 stops flowing, it completely encapsulates the electrical connection between flexible circuit 140 and fluid-ejecting substrate 120. This means that the electrical connection can be completely encapsulated by dispensing encapsulant 160 onto portions of the electrical connection that are accessible from substantially above by wicking encapsulant 160 to portions of the electrical connection that are substantially inaccessible from above, such as by using channel 134. This enables fluid-ejecting substrate 120 to be adhered to carrier 110 before encapsulation rather than after, as is done conventionally. Adhering fluid-ejecting substrate 120 to carrier 110 before encapsulation rather than after acts to reduce stresses on the electrical connection that are transferred to fluid-ejecting substrate 120. These stresses can result in premature failure of fluid-ejecting substrate 120 in that the stresses act to pull apart layers that form fluid-ejecting substrate 120.

For another embodiment, a film 170, e.g., a polymer film, such as a polyester film (e.g., MYLAR LBT), may be located atop encapsulant 160 (FIGS. 1 and 2) before curing. Film 170 helps retain some of encapsulant 160 on top of leads 142. For one embodiment, encapsulant 160 is a paste, such as an epoxy. For another embodiment, thixotropes, such as fumed silica particles (e.g., about 0.1 to about 1.0 micron particles), alumina particles (e.g., about 1.0 to about 50 micron particles), etc., are added to the paste to enhance wicking. For another embodiment, encapsulant 160 is a paste at about 20° C. to about 25° C., and when heated to about 65° C. to about 145° C., it wicks to desired locations. For some embodiments, a silane coupling agent is added to encapsulant 160 to enhance wicking.

For another embodiment, encapsulant 160 is dry and disposed on a film, such as film 170, and the film is positioned as shown in FIG. 1 for film 170. The film is heated to about 165° C., causing it to liquefy and flow (or wick) over upper surface 145 of film 144, on upper portions of leads 142, and on upper surface 148 of fluid-ejecting substrate 120 and to wick through interstices 162 (FIG. 2) and through channel 134, as described above.

For some embodiments, the surfaces contacted by encapsulant 160 in FIG. 1, i.e., upper surface 145 of film 144, leads 142, upper surface 148 of fluid-ejecting substrate 120, and the bounding surfaces of channel 134, are treated before dispensing encapsulant 160 thereon to improve wetting and adhesion. For one embodiment, the treatment is a plasma treatment (or plasma etch) or a chemical etch that acts to polarize and roughen the surfaces. For another embodiment, a laser is used to roughen the surfaces by cutting grooves into the surfaces.

For other embodiments, the flow of encapsulant 160 to the underside of leads 142, i.e., through interstices 162 and channel 134, may involve using a vacuum to draw encapsulant 160 to the underside of leads 142 or pressurized air to push encapsulant 160 to the underside of leads 142. For one embodiment, the assembly of FIG. 1 may be centrifuged for forcing the encapsulant 160 to the underside of leads 142. For some embodiments, encapsulant 160 is forced to the underside of leads 142 from the top using a needle dispense. For one embodiment, encapsulant 160 is forced through the needle using a syringe.

Figure 3:
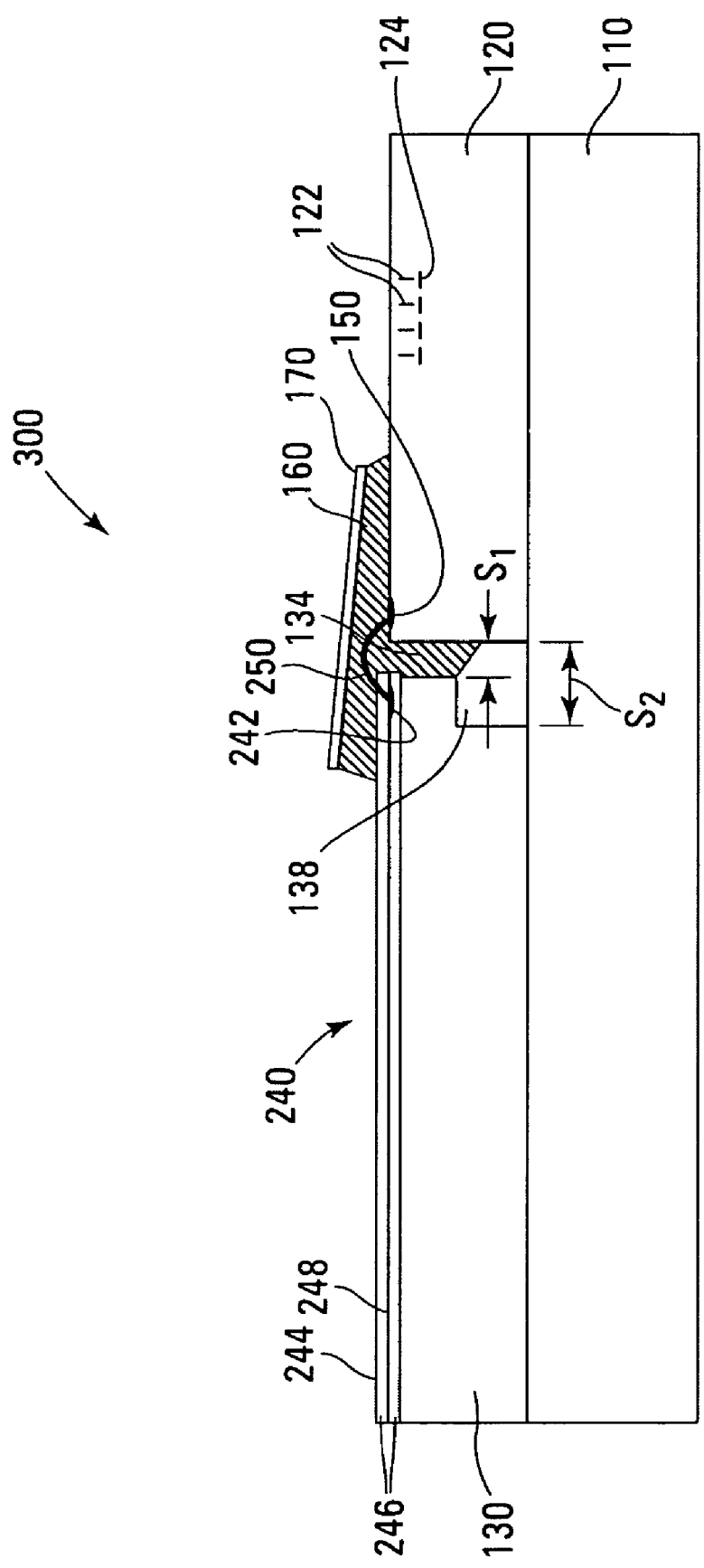
FIG. 3 is a cross-sectional view of another embodiment of a fluid-ejection device, according to another embodiment of the invention.
Figure 4:
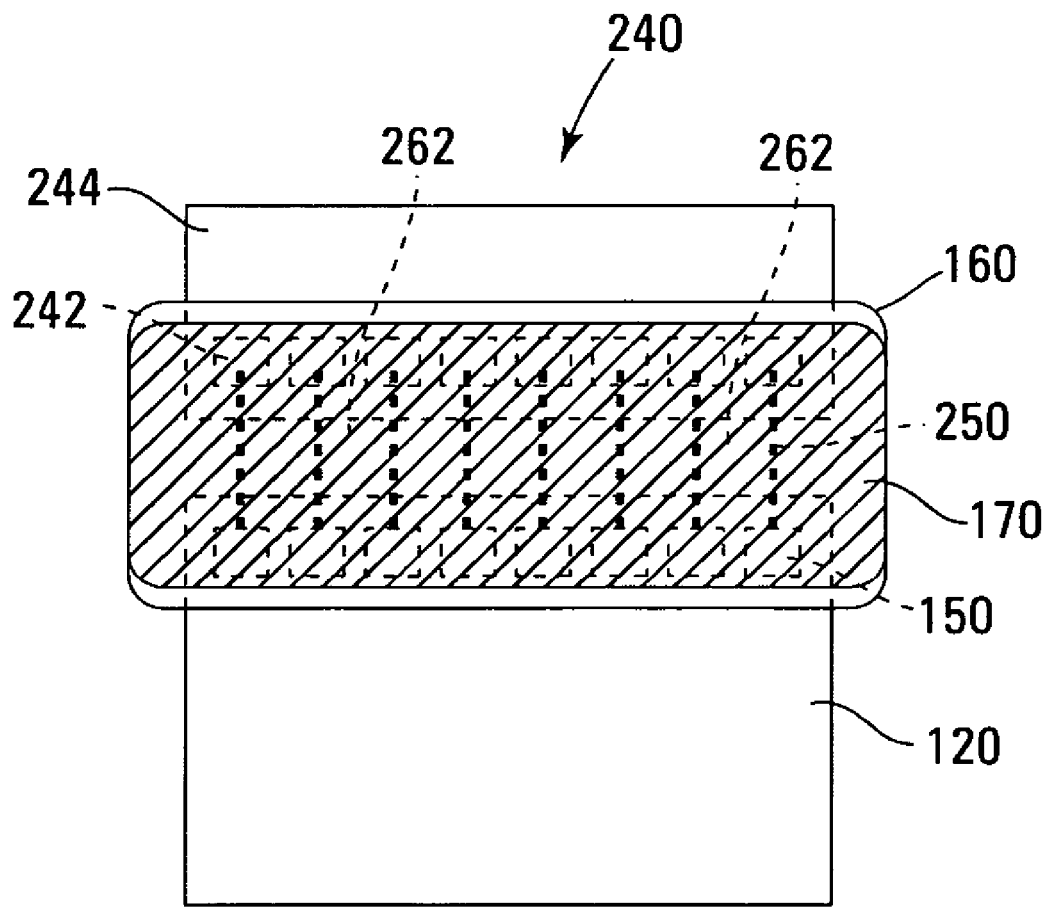
FIG. 4 is a top view of a portion of the fluid-ejection device of FIG. 3, according to another embodiment of the invention.

FIGS. 3 and 4 are respectively cross-sectional and top views of a fluid-ejection device 300, according to another embodiment. Elements in FIGS. 3 and 4 that are similar to elements in FIGS. 1 and 2 use the same reference numbers as in FIGS. 1 and 2 and are as described above. In FIGS. 3 and 4, a flexible circuit 240 is adhered to an upper surface of spacer 130, e.g., by an adhesive, such an epoxy. Flexible circuit 240 includes contacts (or bond pads) 242 that are exposed at an upper surface 244 of a film 246, as shown in FIGS. 3 and 4. For one embodiment, film 244 may be a polymer, such as polyimide, polyester, polyethylene naphthalate (PEN), etc. Conductive traces 248 are disposed in film 246 and are respectively electrically connected to contacts 242. Contacts 242 are respectively electrically connected to contacts 150 of fluid-ejecting substrate 120 using wire bonds 250, as is known in the art, to form an electrical connection between flexible circuit 240 and fluid-ejecting substrate 120.

Encapsulation of the electrical connection between flexible circuit 240 and fluid-ejecting substrate 120, e.g., wire bonds 250, contacts 242, and contacts 150 using encapsulant 160 is generally as described above in conjunction with FIGS. 1 and 2. That is, encapsulant 160 is dispensed from above and wicks downward through interstices 262 between successively adjacent bond wires 250 (FIG. 4), around bond wires 250, and through channel 134 (FIG. 3). Wicking stops when encapsulant 160 encounters channel expansion 138. For one embodiment, film 170 retains some of encapsulant 160 on top of bond wires 250. For other embodiments, the surfaces contacted by encapsulant 160 in FIG. 3 are treated before dispensing encapsulant 160 thereon to improve wetting and adhesion, as described above.

CONCLUSION

Although specific embodiments have been illustrated and described herein it is manifestly intended that the scope of the claimed subject matter be limited only by the following claims and equivalents thereof.

What is claimed is:

1. A method of encapsulating an electrical connection, comprising:

dispensing an encapsulant on a first side of the electrical connection only;

disposing a film on a portion of the encapsulant after dispensing the encapsulant on the first side of the electrical connection but before curing the encapsulant to retain some of the encapsulant on the first side of the electrical connection; and directing the encapsulant to a second side of the electrical connection from the first side, wherein the second side generally faces opposite the first side.

2. The method of claim 1, wherein directing the encapsulant to a second side of the electrical connection comprises wicking the encapsulant.

3. The method of claim 1, wherein directing the encapsulant to a second side of the electrical connection comprises directing the encapsulant through interstices between leads or wire bonds of the electrical connection.

4. The method of claim 3, wherein directing the encapsulant through interstices between leads or wire-bonds of the electrical connection comprises wicking the encapsulant through the interstices.

5. The method of claim 3, wherein directing the encapsulant to a second side of the electrical connection further comprises directing the encapsulant through a channel that is spanned by the leads or wire bonds.

6. The method of claim 5, wherein directing the encapsulant through the channel comprises wicking the encapsulant through the channel.

7. The method of claim 1 further comprises stopping the encapsulant using a capillary stop.

8. The method of claim 1, wherein the electrical connection is an electrical connection between a flexible circuit and a fluid-ejecting substrate.

9. The method of claim 1 further comprises treating surfaces to be contacted by the encapsulant prior to dispensing the encapsulant.

10. The method of claim 9, wherein treating surfaces to be contacted by the encapsulant comprises a plasma treatment, laser roughening, or chemical etching.

11. The method of claim 1, wherein dispensing an encapsulant on a first side of the electrical connection comprises heating the encapsulant.

12. A method of encapsulating an electrical connection between a flexible circuit and a fluid-ejecting substrate, comprising:

dispensing an encapsulant on a first side of the electrical connection only;

disposing a film on a portion of the encapsulant after dispensing the encapsulant on the first side of the electrical connection but before curing the encapsulant to retain some of the encapsulant on the first side of the electrical connection and wicking the encapsulant to a second side of the electrical connection from the first side through interstices between leads or wire bonds of the electrical connection, wherein the second side faces generally opposite the first side.

13. A method of forming a fluid-ejection device, comprising:

attaching a fluid-ejecting substrate to a carrier;

attaching a flexible circuit to the carrier;

forming an electrical connection between the flexible circuit and the fluid-ejecting substrate; and encapsulating the electrical connection after attaching the fluid-ejecting substrate to the carrier, wherein encapsulating the electrical connection comprises:

dispensing an encapsulant on a first side of the electrical connection only;

disposing a film on a portion of the encapsulant after dispensing the encapsulant on the first side of the electrical connection but before curing the encapsulant to retain some of the encapsulant on the first side of the electrical connection; and directing the encapsulant to a second side of the electrical connection from the first side, wherein the second side generally faces opposite the first side.

14. The method of claim 13, wherein directing the encapsulant to a second side of the electrical connection comprises wicking the encapsulant.

15. The method of claim 13, wherein directing the encapsulant to a second side of the electrical connection comprises directing the encapsulant through interstices between leads or wire bonds of the electrical connection.

16. The method of claim 15, wherein directing the encapsulant through interstices between leads or wire-bonds of the electrical connection comprises wicking the encapsulant through the interstices.

17. The method of claim 15, wherein directing the encapsulant to a second side of the electrical connection further comprises directing the encapsulant through a channel that is spanned by the leads or wire bonds.

18. The method of claim 17, wherein directing the encapsulant through the channel comprises wicking the encapsulant through the channel.

19. The method of claim 13 further comprises stopping the encapsulant using a capillary stop.

20. The method of claim 13 further comprises treating surfaces to be contacted by the encapsulant prior to dispensing the encapsulant.

21. The method of claim 13, wherein the encapsulant is selected from the group consisting of a paste, a paste containing thixotropes, a paste containing alumina particles, a paste containing fumed silica particles, and a paste that when heated flows.

22. The method of claim 13, wherein directing the encapsulant to a second side of the electrical connection comprises drawing the encapsulant to the second side using a vacuum, pressurizing the encapsulant on the first side to push the encapsulant to the second side, or centrifuging the encapsulant from the first to second side.

23. The method of claim 13, wherein the fluid-ejection device is a print head.

24. The method of claim 13, wherein attaching a flexible circuit to the carrier comprises attaching the flexible circuit to an upper surface of a spacer attached to the carrier.

25. The method of claim 13, wherein forming an electrical connection between the flexible circuit and the fluid-ejecting substrate is performed before attaching the flexible circuit to the carrier.

* * * * *